(12) United States Patent
Fray et al.

(10) Patent No.: US 8,790,953 B2
(45) Date of Patent: Jul. 29, 2014

(54) METHOD FOR TEXTURING SILICON SURFACE TO CREATE BLACK SILICON FOR PHOTOVOLTAIC APPLICATIONS

(76) Inventors: Derek John Fray, Cambridge (GB);
Eimutis Juzeliunas, Cambridge (GB)

(*) Notice: Subject to any disclaimer, the term of this patent is extended or adjusted under 35 U.S.C. 154(b) by 69 days.

(21) Appl. No.: 13/805,247

(22) PCT Filed: Jun. 27, 2011

(86) PCT No.: PCT/GB2011/051213
§ 371 (c)(1),
(2), (4) Date: Dec. 18, 2012

(87) PCT Pub. No.: WO2011/161479
PCT Pub. Date: Dec. 29, 2011

(65) Prior Publication Data
US 2013/0095596 A1   Apr. 18, 2013

(30) Foreign Application Priority Data
Jun. 26, 2010 (GB) ................................. 1010772.0

(51) Int. Cl.
*H01L 21/00* (2006.01)

(52) U.S. Cl.
USPC ............. 438/71; 438/665; 438/666; 438/674; 438/681; 438/778; 438/787; 257/E21.174; 257/E21.215; 257/E21.479; 257/E21.485

(58) Field of Classification Search
CPC .............. C25C 3/00; C25C 3/02; C25C 3/28; C25C 7/005; C25C 7/04; H01L 31/02363; H01L 31/18; H01M 4/386
USPC ........... 438/71, 665, 666, 674, 681, 778, 787; 257/E21.174, E21.215, E21.479, 257/E21.485
See application file for complete search history.

(56) References Cited

PUBLICATIONS

Ma, L., et al: *Wide-band black silicon based on porous silicon*, Applied Physics Letters, AIP, American Institute of Physics, Melville, NY, US, vol. 88, No. 17, Apr. 25, 2001, p. 88.
Yasuda, K., et al: *Effect of electrolysis potential on reduction of solid silicon dioxide in molten CaCl2*, Journal of Physics and Chemistry of Solids, Pergamon Press, London, GB, vol. 66, No. 24, Feb. 1, 2005, p. 443.
International Application No. PCT/GB2011/051213, filed Jun. 27, 2011, PCT Search Report and Written Opinion, 6 pages.

*Primary Examiner* — Michelle Mandala
(74) *Attorney, Agent, or Firm* — Kilpatrick Townsend & Stockton LLP

(57) ABSTRACT

The surface of silicon is textured to create black silicon on a nano-micro scale by electrochemical reduction of a silica layer on silicon in molten salts. The silica layer can be a coating, or a layer caused by the oxidation of the silicon.

13 Claims, 6 Drawing Sheets

METHOD FOR TEXTURING SILICON SURFACE TO CREATE BLACK SILICON FOR PHOTOVOLTAIC APPLICATIONS

FIELD OF INVENTION

The present invention relates to a method of producing a textured silicon surface, particularly but not exclusively for photovoltaic (PV) applications.

TECHNICAL BACKGROUND

Texturing is the creation of roughness on the surface of silicon in order to create multiple reflection of the light incident on the surface, thereby, creating a greater absorption of the light inside the material. This results in a reduction of the optical reflectivity of the surface and an increase in the length of the optical path travelled by the incident light within the silicon. The overall effect increases the efficiency by which light is transformed into electricity.

THE PRIOR ART

The world PV electricity production has, in recent years, experienced an exponential growth. Nevertheless, solar energy conversion still remains relatively costly when compared to the power generated from fossil or nuclear fuels. Cost reduction of photo-electricity, therefore, is high on the agenda of PV engineers and materials scientists. Vast majority of the solar cells are produced from silicon and, as bare silicon reflects more than 30% of the incident light, its surface is textured and coated by antireflection coatings [1,2]. Black silicon provides an effective approach to reduce the light reflection losses. This type of silicon is also attractive in solar-driven generation of hydrogen from water, where the photo-efficiency of silicon electrode is limited by light absorption [3]. Black silicon, as a porous material, is attractive in many fields where specifically the high silicon surface to volume ratio is of importance: in-vivo drug delivery [4,5], electrochemical batteries [6-11] and as a platform for various sensors—chemical and biological [1, 12-15], microfluidic flow [16], pressure, temperature [17], gas [18] and magnetic [19]. Black silicon exhibits the optical properties, which are not typical for the indirect semiconductors such as silicon, as it shows emission in the terahertz range [20]. Visible and near-infrared photoluminescence from black surface has also been determined, which is of great importance in sensor-related applications [21].

Various surface engineering techniques have recently been investigated to obtain black silicon. Surface roughness at micro and nano scales was created by femtosecond laser engineering [21, 22-25] with subsequent sample etching [22], annealing in vacuum [21] or coating by thermal oxide chloroalkylsilane layers [25]. Light absorption properties were improved by transparent conducting oxides deposited using thermal atomic layer deposition [26]. A variety of surface etching techniques have been applied: deep reactive ion etching using oxygen inhibitor pulses [27], chemical etching using nanoparticle (Au) catalysts [28,29], inductively coupled plasma and cryogenic etching [30]. Vapor-liquid-solid reactions using Au as a catalyst and silane as the silicon source also have been studied [31]. Most of these techniques are, however, too costly and technically sophisticated to be applied in silicon mass production. Furthermore, etchings usually involve toxic and aggressive chemicals, such as hydrofluoric acid, and in certain cases—expensive catalysts.

STATEMENT OF INVENTION

According to one broad aspect of the present invention, there is provided a method for silicon surface texturing on nano-micro scale comprising electrochemical reduction of a silica layer on silicon in molten salts. Such a method is capable of creating spherical sub-micron formations, pores as well as fine nano-structures on silicon. In another broad aspect, there is provide a method for creating textured surfaces which are capable of absorbing light efficiently, by the reduction of silica films on silicon by applying a potential sufficient to reduce the silica but not to deposit a cation from a salt electrolyte in an electrolytic cell.

In accordance with another aspect of the present invention, there is provided a method of producing a textured silicon surface, comprising: providing a silicon substrate with a surface layer of silica; attaching or coupling an electrical conductor to the surface layer of silica to provide a silica/electrical conductor connection; providing an electrolytic or electrochemical cell including a molten salt electrolyte, with the silica/electrical conductor connection forming at least part of one electrode; and applying a potential to the electrical conductor sufficient to reduce the surface layer of silica without depositing a cation from the molten salt electrolyte.

The present applicants have found that by reducing the surface layer of silica in this way, a textured silicon surface is created. The silica/electrical conductor connection may comprise direct contact between the electrical conductor and the surface layer of silica, perhaps creating an interface therebetween. Cation deposition from the molten salt electrolyte may be avoided by determining a deposition potential for the onset of cation deposition in the electrolytic cell, and ensuring that the applied potential does not exceed the deposition potential.

The method may further comprise forming the surface layer of silica by coating the silicon substrate with silica. Alternatively, the method may further comprise forming the surface layer of silica by oxidising the silicon substrate.

The electrical conductor may consist of a material which is stable in the molten salt electrolyte. For example, the electrical conductor may be selected from the group consisting of molybdenum and tungsten. Alternatively, the electrical conductor may be formed from other metals or even metal alloys.

The molten salt electrolyte may be heated to a temperature from 500° C. to 1000° C. The molten salt electrolyte may comprise or consist of a halide of calcium, barium, strontium or lithium. For example, the molten salt electrolyte may be calcium chloride, and may be heated to a temperature of 850° C. Alternatively, the molten salt electrolyte may have a melting point below 100° C., such as room temperature of about 18 to 25° C. Such low temperature ionic melts, sometimes referred to as room temperature ionic liquids, include 1-butyl-1-methylpyrrolidinium and 1-ethyl-3-methylimidazolium, either of which may be suitable for silicon de-oxygenation in accordance with the present invention.

The method may further comprise maintaining the potential applied until a surface morphology with globular structures including single nano-spheroids are formed. The surface morphology may include pores, each with a diameter of at least 50 nm, possibly even at least 100 nm.

The surface layer of silica may have a thickness of about 10 nm or more, prior to its reduction in the electrolytic cell. For example, the thickness of the surface layer of silica may be in the range 10 nm to 10 µm, and may be about 2

The electrolytic cell also includes an anode, and this may be formed from an inert material, such as graphite.

BRIEF DESCRIPTION OF THE DRAWINGS

Embodiments of the present invention will now be described by way of example and with reference to the accompanying figures, in which.

DETAILED DESCRIPTION

It is known that silica readily forms upon the surface of silicon, even at room temperature. Silica contains two oxygen atoms for every silicon atom so that the removal of the oxygen is likely to lead to vacancies, which can diffuse to form pores. It is important to be able to remove the oxygen as oxygen ions or oxygen atoms rather than form another compound. Silica is a stable oxide that is not readily reduced by hydrogen or carbon containing gases such as carbon monoxide. Hydrogen is a weak-reducing gas and, although carbon-containing gases can reduce silica at very elevated temperatures, the product is likely to be contaminated with carbon to the detriment of the optical properties.

An electrochemical method of reducing metal oxides was discovered in which the oxide is made the cathode in a bath of calcium chloride or similar stable salt and a cathodic potential is applied [32,33]. Under the applied potential, the oxygen atoms ionize and dissolve in the salt rather than the deposition of the cation from the salt. Many reports demonstrate that this is possible for plates or pellets of silica [33-39].

Figure 6:
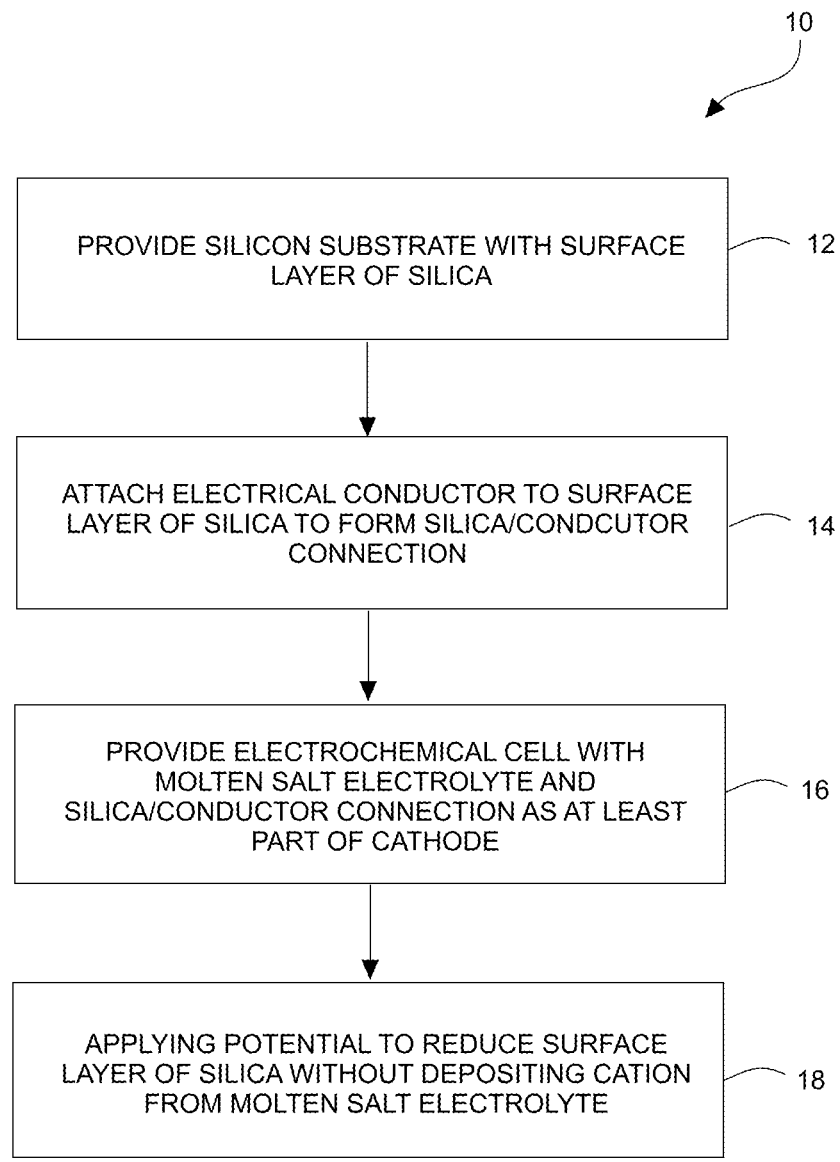
FIG. 6. is a flow chart illustrating a method of producing a textured silicon substrate.

FIG. 6 illustrates schematically a method 10 of producing a textured silicon substrate according to an embodiment of this invention. A silicon substrate in the form of a silicon wafer is provided at step 12. The silicon substrate has a surface layer of silica. Silica films may be formed on the surface of silicon wafers in a number of different ways, for example either by coating with silica or by exposure to air either at ambient or elevated temperature. The "as received" silicon wafers have a thin layer of silica on the surface. The oxide of interest may be also formed in solutions, such as in polishing slurries. At step 14, an electrical conductor is positioned in contact with the surface layer of silica to provide a silica/electrical conductor connection or interface. At step 16, an electrochemical cell including a molten salt electrolyte is provided, with the silica/electrical conductor interface forming at least part of one electrode. For example, the silicon wafers are made the cathode in a bath of calcium chloride. A cathodic potential is applied at step 18, without depositing a cation from the molten salt electrolyte. After electrochemical treatment, the wafers were washed and the surface characterized by examination in a scanning electron microscope, x-ray diffraction, x-ray photoelectron spectroscopy and the measurement of reflectance.

EXAMPLES

Analytical grade anhydrous CaCl$_2$ was used to prepare the electrolyte. The salt was kept under vacuum at elevated temperatures to remove residual water and Ca(OH)$_2$. The heating pattern involved an increase of temperature from ambient to 80° C. and holding for 3 hours, then to 120° C., holding for 3 hours, and finally to 180° C., holding for 18 hours.

A cylindrical alumina crucible was used to house the electrochemical cell whose height was 100 mm and wall thickness was 3 mm. The crucible was filled with salt and placed inside a stainless steel reactor in a vertical tube furnace (Instron SFL, UK). The salt was melted at 850° C. The depth of electrolyte in the crucible was about 4 cm. The electrolyte was purified by pre-electrolysis using three cylindrical graphite rods, which served as working, pseudo-reference and counter electrodes. The purification was performed at polarization ΔE=−1.0 V vs. graphite pseudo-reference electrode. Electrolysis time was 20 hours.

Figure 1A:
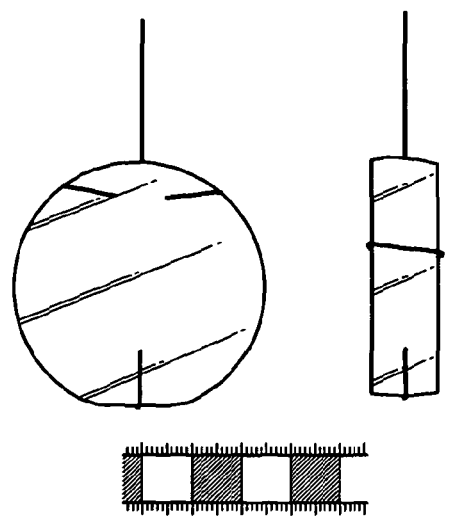
FIG. 1. shows a Si—SiO$_2$ wafer and rectangular sample in a molybdenum wire frame: a) polished side; b) unpolished side; c) reduced (left) and original sample (right)
Figure 1B:
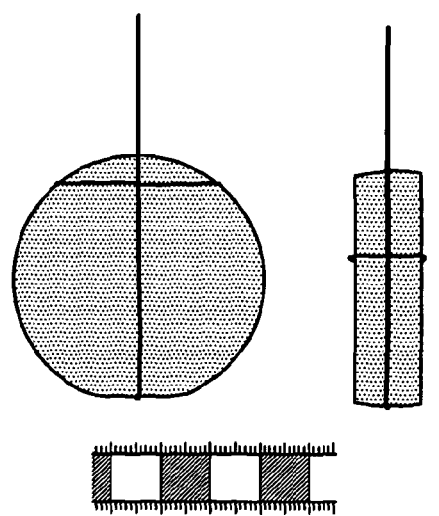
Figure 1C:
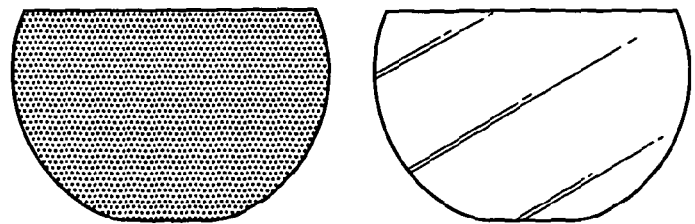
Figure 2:
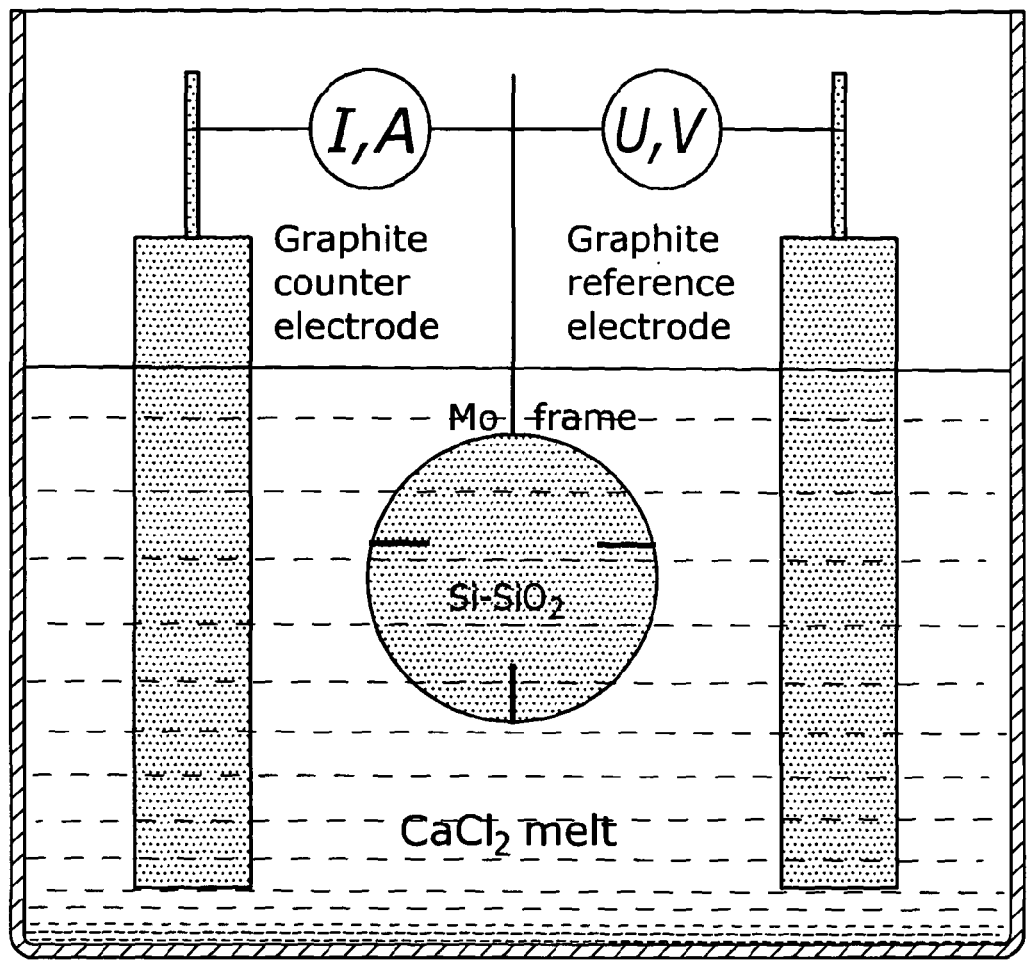
FIG. 2 illustrates schematically an electrochemical cell used in a method embodying one aspect of the present invention.

P-type silicon wafers sliced from a <100>single-crystal were used (from Si-Mat GmbH, Germany). Diameter of the wafer was about 5 cm (about 2"), geometric area ~22.8 cm$^2$, thickness ~275±25 μm and resistivity 1 to 30 ohm/cm. The wafers were coated with a thermal oxide layer, whose average thickness was 2.0243 μm. One side of the specimen was polished. The samples were attached to an electrical or electronic conductor in the form of a molybdenum rod (0.5 mm) frame as shown in FIG. 1. Rectangular specimens (5 cm$^2$) were prepared from the wafer using a diamond knife and mechanical breaking.

Graphite cylindrical rods served both as pseudo-reference and counter electrodes. The graphite electrode was calibrated by measuring the potential for calcium deposition. This was at ca. −1.5 V and exhibited good reproducibility.

Cyclic polarization measurements for Mo electrode indicated the onset of calcium deposition (Ca$^{2+}$+2e→Ca) below E ~−1.5 V vs. graphite. Silicon reduction starts at much more positive potentials, roughly, +0.9 V vs. E$°_{Ca2+/Ca}$[37]. To deoxygenate the silica layer, we performed potentiostatic electrolysis at E=−1.0 V to −1.25 V vs. graphite, which is appropriate to reduce silicon and prevent calcium co-deposition. Electrochemical reduction of solid oxides in molten salts occurs at a three-phase interface lines (3PIs) [34-37,40]. In our experiments, the initial three-phase interface is composed from the electronic conductor (Mo), the oxide (SiO$_2$) and the electrolyte (CaCl$_2$). The molybdenum wire attached to silica surface played the role of current collector. The electrochemical silicon reduction starts at the interface Mo—SiO$_2$—CaCl$_2$

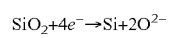

$$SiO_2 + 4e^- \rightarrow Si + 2O^{2-} \qquad (1)$$

The oxygen ions are removed by diffusion to electrolyte and the produced silicon takes a further role of an electronic conductor by forming a new three-phase interface Si—SiO$_2$—CaCl$_2$. As a result, propagation of the reduction area and formation of thin silicon film is possible. Once the reduced silicon has contact with the silicon substrate, the entire wafer starts to act as an electronic conductor.

Figure 3A:
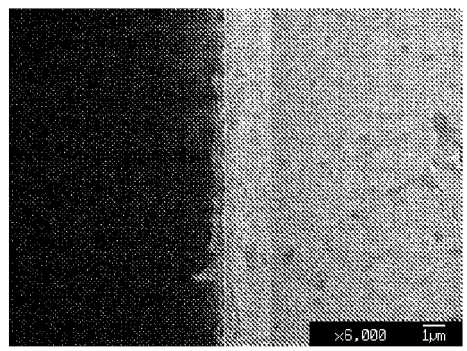
FIG. 3. shows SEM images: (a)—side view of pristine sample with 2 μm SiO$_2$ layer; (b)—top view of the sample with 2 μm SiO$_2$ precursor after 3 min deoxygenating in molten CaCl$_2$ at 850° C. and −1.0 V; (c) top view after 17 min deoxygenating at −1.25 V; (d) side view of the sample prepared analogous to (c) [the scale bar for (c) and (d) is 200 nm]
Figure 3B:
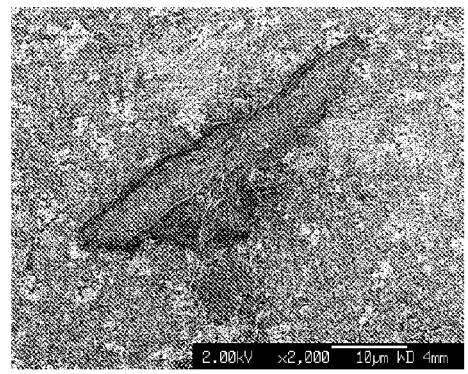

Already during the first minutes of deoxygenating, the visually shiny surface transforms into matt and black one. FIG. 3b shows on a micrometer scale the surface features of the silica precursor deoxygenated for 3 min. The process has spread over the surface, however, some micrometer-sized locations remain still poorly covered (the dark zone in the Figure). The filament-like formations in such locations imply traces of three-phase interface lines. The surface shows great ability to absorb visible light. The reflectance spectra in FIG. 4 identifies the surface reflectance 6-8% in the visible region. Note that for silicon solar cells the most useful part of solar spectrum is the visible region at $\lambda$=650-700 nm [1].

Figure 3C:
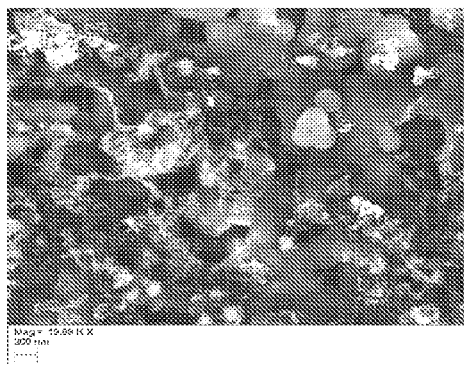
Figure 3D:
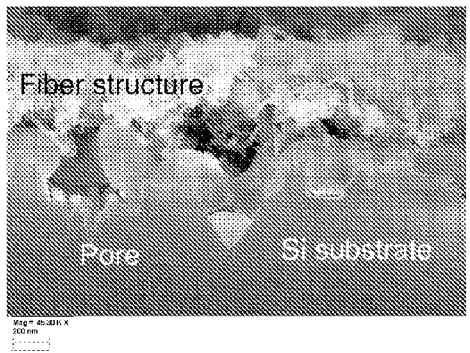
Figure 4:
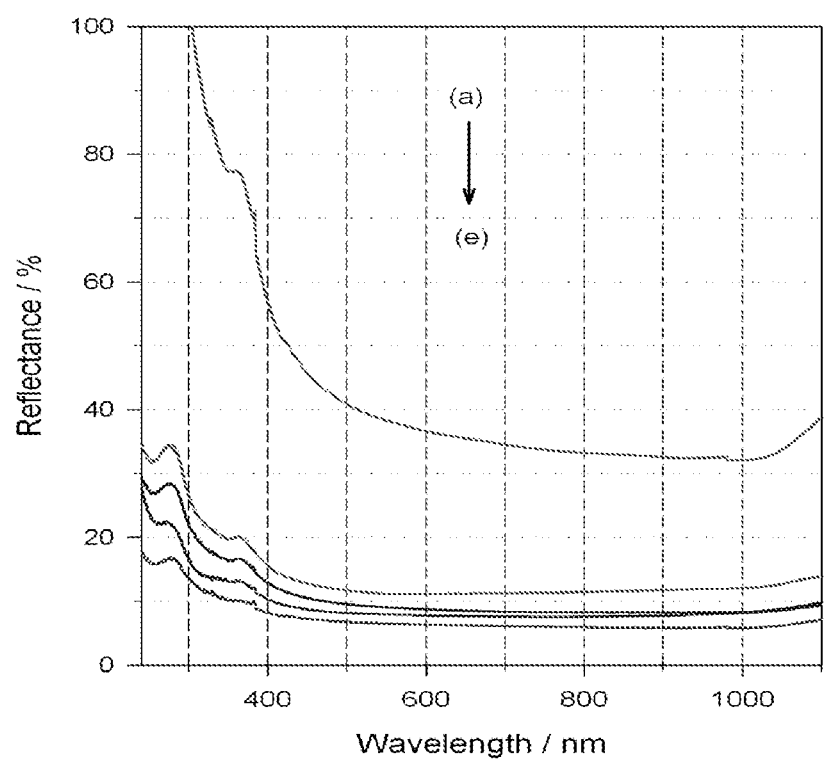
FIG. 4. shows surface reflectance spectra: (a) bare silicon; (b)-(e)-2 μm SiO$_2$ layer deoxygenated in molten CaCl$_2$ at 850° C. and −1.25 V versus graphite. Electrolysis time: (b) −1 h, (c) 17 min; (d)-(e) 3 min.

Substantial changes occur in surface morphology during prolonged silica layer deoxygenating. FIG. 3c,d shows surface features at nano-micro scale after 17 minutes of electrolysis. Globular structures including single nano-spheroids are formed, which tend to agglomerate and confine void spaces, i.e. pores (FIG. 3c). The pore size is of the order of hundreds of nanometers, thus, they could be ascribed to macropores. (According to IUPAC classification, the micropores are those below 2 nm in diameter, the mesopores in the range 2 nm to 50 nm and the macropores greater than 50 nm.) A fine nanofibre structure decorates the porous layer, which is well identified on the side-view of the cleaved sample (FIG. 3d). The side-view identifies also the surface layer shrinking due to the oxygen leaving the silica layer. Clearly, thickness of the deoxidated structure is less than 1 µm. The depth of the pores is of the order of hundreds of nanometers. The fibre structure is composed of the filaments, whose thickness is of the order of tens of nanometers. The deoxygenated layer exhibits specifically high surface to volume ratio providing a large surface area for light trapping. The surface showed the reflectivity around 8% in a wide visible region (FIG. 4). Extension of the electrolysis time to 1 h did not improve the antireflection properties (~11%, FIG. 4). It may be, therefore, concluded that the initial structures of the deoxygenated surface are most effective in terms of light trapping performance.

Figure 5:
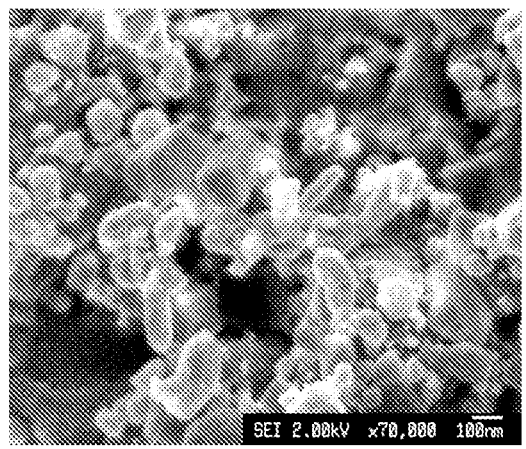
FIG. 5. shows a silicon surface obtained from 10 nm SiO$_2$ layer by deoxygenating for 3 min (other condition as those given in FIG. 3), and for which a reflectance of 6% was measured for this sample in wide visible region.

The next example shows black silicon formation using silicon wafer with a very thin silica layer (10 nm) as a precursor. Nano-roughness was achieved by deoxygenating of such layer. The surface features are shown in FIG. 5. The surface is composed of nano-crystals whose size is less then 100 nm. The sample absorbs effectively visible light—ca. 6% reflectance was found within a wide wavelength region.

Thus, versatile and novel silicon surface architectures, which effectively absorb light in a wide visible region, were obtained by electrochemical deoxidation of thin silica layer in molten salt. The obtained surfaces with reflectance 6-11% (at $\lambda$=650-700 nm) outperform chemically etched textures (20-25%) and are well comparable with the porous silicon produced in HF electrolyte (6-9%) as well as conventional vacuum-deposited SiN or $TiO_2/MgF_2$ films (~10%) W. The proposed method, however, does not involve aggressive or toxic chemicals and costly vacuum techniques. The concept opens the route for cheaper solar cells, as the procedures are quite simple, rapid and has good scaling-up possibilities. The invention shows the concept in principle, whereas further advanced surface functional properties could be achieved by varying numerous conditions: CV protocols, temperature, electrolyte, type of substrate and oxide precursors.

OTHER PUBLICATIONS

[1] P. Singh, S. N. Sharma, N. M. Ravindra, *JOM* 2010, 62, 15.
[2] J. Szlufcik, G. Agostinelli, F. Duerinckx, E. Van Kerschaver, G. Beaucarne, in *Solar Cells: Materials, Manufacture and Operation* (Eds: T. Markvart and L. Castauer) Elsevier Ltd. 2005, 91.
[3] S. W. Boettcher, J. M. Spurgeon, M. C. Putnam, E. L. Warren, D. B. Turner-Evans. M. D. Kelzenberg, J. R. Maiolo, H. A. Atwater, N. S. Lewis, *Science* 2010, 327, 185.
[4] E. J. Anglin, L. Cheng, W. R. Freeman, M. J. Sailor. *Advanced Drug Delivery Reviews* 2008, 60, 1266.
[5] J. Salonen, A. M. Kaukonen, J. Hirvonen, V. P. Lehto. *J. Pharm. Sci.* 2008, 97, 632.
[6] L. Bagetto, D. Danylov, P. H. L. Notten, *Adv. Mater.* 2011, 23, 1563.
[7] U. Kasavajjula, C. Wang, A. J. Appleby. *J. Power Sources* 2007, 163, 1003.
[8] M. Winter, J. O. Besenhard, M. E. Spahr, P. Novak, *Adv. Mater.* 1998, 10, 725.
[9] S. Ohara, J. Suzuki, K. Sekino, T. Takamura. *J. Power Sources* 2004, 36, 303.
[10] K. Q. Peng, J. J. Hu, Y. J. Yan, Y. Wu, H. Fang, Y. Xu, S. T. Lee, J. Zhu. *Adv. Funct. Mater.* 2006, 16, 387.
[11] K. Peng Y. Wu, H. Fang, X. Zhong, Y. Xu, J. Zhu. *Angew. Chem. Int. Ed.* 2005, 44, 2737.
[12] A. Jane, R. Dronov, A. Hodges, N. H. Voelcker. *Trends Biotechnol.* 2009, 27, 230.
[13] K. A. Kilian, T. Böcking, J. J. Gooding. *Chem. Commun.* 2009, 630.
[14] L. M. Bonanno, L. A. DeLouise. *Biosens. Bioelectron.* 2007, 23, 444.
[15] L. Lawrie, Y. Jiao, S. M. Weiss. *IEEE Trans. Nanotechnol.* 2010, 9, 596.
[16] D. N. Pagonis, A. Petropolous, G. Kaltsas, A. G. Nassiopoulou, A. Tserepi. *Phys. Stat. Sol.* 2007, A 204, 1474.
[17] C. Pramanik, H. Saha, U. Gangopadhyay. *J. Micromech. Microeng.* 2006, 16, 1340.
[18] S. Ozdemir, J. L. Gole. *Curr. Opin. Solid State Mat. Sci.* 2007, 11, 92.
[19] P. Granitzer, K. Rumpf, H. Kren. *J. Nanomater.* 2006, 1.
[20] P. Hoyer, M. Theuer, R. Beigang, E. B. Kley, *Appl. Phys. Lett.* 2008, 93, 091106.
[21] A. Serpenguezel, A. Kurt, I. Inane, J. E. Cary, E. Mazur, *J. Nanophoton.* 2008, 2, 021770.
[22] H. Mei, C. Wang, J. Yao, Y. C. Chang, J. P. Cheng, Y. Zhu, S. Z. Yin, C. Luo, *Opt. Commun.* 2011, 284, 1072.
[23] R. Torres, V. Vervisch, M. Halbwax, T. Sarnet, P. Delaporte, M. Sentis, J. Ferreira, D. Barakel, S. Bastide, F. Torregrosa, H. Etienne, L. Roux, J. Optoelectron. *Adv. Mater.* 2010, 12, 621.
[24] J. E. Carey, J. Sickler, *Laser Focus World* 2009, 45, 39.
[25] M. Barberoglou, V. Zorba, A. Pogozidis, C. Fotakis, E. Stratakis, *Langmuir* 2010, 26, 13007.
[26] M. Otto, M. Kroll, T. Kasebier, S. M. Lee, M. Putkonen, R. Salzer, P. T. Miclea, R. B. Wehrspohn, *Adv. Mater.* 2010, 22, 5035.
[27] H. V. Jansen, M. J. de Boer, K. Ma, M. Girones, S. Unnikrislman, M. C. Louwerse, M. C. Elwenspoek, *J. Micromechan. Microengineer.* 2010, 20, Art. No. 075027.
[28] H. C. Yuan, V. E. Yost, M. R. Page, P. Stradins, D. L. Meier, H. M. Branz, *Appl. Phys. Lett.* 2009, 95, 123501.
[29] H. M. Branz, V. E. Yost, S. Ward, K. M. Jones, B. To, P. Stradins, *Appl. Phys. Lett.* 2009, 94, 231121.
[30] Y. D. Lim, S. H. Lee, W. J. Yo, *J. Korean Phys. Soc.* 2009, 54, 616.
[31] C. L. Cheng, C. W. Liu, J. T. Jeng, B. T. Dai, Y. H. Lee, *J. Electrochem. Soc.* 2009, 156, H356.
[32] G. Z. Chen, D. J. Fray, T. W. Farthing, *Nature* 2000, 407, 361.
[33] T. Nohira, K. Yasuda, Y. Ito, *Nat. Mater.* 2003, 2, 397.
[34] X. Jin, P. Gao, D. Wang, X. Hu, G. Z. Chen, *Angew. Chem. Int. Ed.* 2004, 43, 733.

[35] K. Yasuda, T. Nohira, K. Amezawa, Y. H. Ogata, Y. Ito, *J. Electrochem. Soc.* 2005, 152, D69.
[36] P. C. Pistorius, D. J. Fray, *J. S. Afr. Inst. Min. Metall.* 2006, 106, 31.
[37] W. Xiao, X. Jin, Y. Deng, D. Wang, X. Hu, G. Z. Chen, *Chem Phys Chem.* 2006, 7, 1750.
[38] S.-C. Lee, J.-M. Hur, C.-S. Seo, *J. Ind. Eng. Chem.* 2008, 14, 651.
[39] K. Yasuda, T. Nohira, Y. Ito. *J. Phys. Chem. Solids* 2005, 66, 443.
[40] E. Juzeliunas, A. Cox, D. J. Fray, *Electrochem. Commun.* 2010, 12, 1270.[41] J. K. Srivastava, M. Prasad, *J. Electrochem. Soc.* 1985, 132, 955.

The invention claimed is:
1. A method of producing a textured silicon surface, comprising:
   providing a silicon substrate with a surface layer of silica;
   attaching an electrical conductor to the surface layer of silica to provide a silica/electrical conductor interface;
   providing an electrolytic cell including a molten salt electrolyte, with the silica/electrical conductor interface forming at least part of one electrode;
   applying a potential to the electrical conductor sufficient to reduce the surface layer of silica without depositing a cation from the molten salt electrolyte.
2. A method according to claim 1, further comprising: forming the surface layer of silica by coating the silicon substrate with silica.
3. A method according to claim 1, further comprising: forming the surface layer of silica by oxidizing the silicon substrate.
4. A method according to claim 1 in which the electrical conductor is stable in the molten salt electrolyte.
5. A method according to claim 4, in which the electrical conductor is selected from the group consisting of molybdenum and tungsten.
6. A method according to claim 1, in which the molten salt electrolyte is at a temperature from 500° C. to 1000° C.
7. A method according to claim 1, in which the molten salt electrolyte comprises or consists of a halide of calcium, barium, strontium or lithium.
8. A method according to claim 7, in which the molten salt electrolyte is calcium chloride.
9. A method according to claim 1, further comprising maintaining the potential applied until a surface morphology with globular structures including single nano-speroids are formed.
10. A method according to claim 9, in which the surface morphology includes pores, each with a diameter of at least 50 nm.
11. A method according to claim 1, in which the electrolytic cell further includes a graphite electrode.
12. The method according to claim 9, in which the surface morphology has a microstructure finer than 1 micron.
13. The method according to claim 12, in which the surface morphology has a microstructure finer than 100 nm.

* * * * *